(12) United States Patent
Lin et al.

(10) Patent No.: US 7,932,529 B2
(45) Date of Patent: *Apr. 26, 2011

(54) LIGHT-EMITTING DIODE DEVICE AND METHOD FOR FABRICATING THE SAME

(75) Inventors: Tzu-Han Lin, Hsinchu (TW); Jui-Ping Weng, Miaoli (TW); Tzy-Ying Lin, Hsinchu (TW); Kuo-Jung Fu, Taipei (TW)

(73) Assignee: VisEra Technologies Company Limited, Hsinchu (TW)

( * ) Notice: Subject to any disclaimer, the term of this patent is extended or adjusted under 35 U.S.C. 154(b) by 397 days.

This patent is subject to a terminal disclaimer.

(21) Appl. No.: 12/200,171

(22) Filed: Aug. 28, 2008

(65) Prior Publication Data

US 2010/0051982 A1    Mar. 4, 2010

(51) Int. Cl.
*H01L 33/00* (2010.01)
*H01L 21/00* (2006.01)
(52) U.S. Cl. .......................................... 257/98; 438/29
(58) Field of Classification Search .......... 438/27, 438/29, 33, 42; 257/98–99, E33.059, E33.067
See application file for complete search history.

(56) References Cited

U.S. PATENT DOCUMENTS

| 7,355,284 | B2 * | 4/2008 | Negley | 257/778 |
| 7,753,573 | B2 * | 7/2010 | Yatsuda et al. | 362/539 |
| 2010/0012957 | A1 * | 1/2010 | Lin et al. | 257/98 |

FOREIGN PATENT DOCUMENTS

| CN | 1881635 | 12/2006 |
| JP | 2005-082788 | 3/2005 |
| JP | 2008-192909 | 8/2008 |

* cited by examiner

*Primary Examiner* — Calvin Lee
(74) *Attorney, Agent, or Firm* — Muncy, Geissler, Olds & Lowe, PLLC

(57) ABSTRACT

A semiconductor device is disclosed. The semiconductor device comprises a light-emitting diode chip disposed in a cavity of a semiconductor substrate. At least two isolated outer wiring layers are disposed on the bottom surface of the semiconductor substrate and are electrically connected to the light-emitting diode chip, serving as input terminals. A lens module is adhered to the top surface of the semiconductor substrate to cap the cavity, in which the lens module comprises a molded lens and a transparent conductive layer coated with a fluorescent material under the molded lens. A method for fabricating the semiconductor devices is also disclosed.

11 Claims, 12 Drawing Sheets

LIGHT-EMITTING DIODE DEVICE AND METHOD FOR FABRICATING THE SAME

BACKGROUND OF THE INVENTION

1. Field of the Invention

The invention relates to a light-emitting diode (LED) device and more particularly to LED devices with a lens module having a fluorescent material prepared by electrophoresis deposition and methods for fabricating the same.

2. Description of the Related Art

Light-emitting diode (LED) devices are solid-state light sources and have been known for years. The LED devices are based on the recombination of electron-hole pairs in a pn-junction in a semiconductor material which is forward-biased. Advantages of LED devices compared with traditional lamps are lower power consumption and longer lifespan. In particular, because white light LED devices have high color rendering index (CRI), it has become one of the most popular illuminating devices used.

A white light LED device can be obtained by mixing red, green, and blue lights using a combination of a red light LED chip (or die), a green light LED chip, and a blue light LED chip to form the white light LED device. However, the above three-in-one white light LED device is expensive because it requires three LED chips for different emitted lights. Moreover, the CRI is reduced due to different light-emitting efficiencies for each of the three LED chips.

In order to address the above drawbacks, a white light LED device has been developed by using a combination of a blue light LED device with a fluorescent material, such as a phosphor material. The blue light passes through the fluorescent red and green phosphor material, such that the combination of blue, red, and green lights produces a white light. Currently, such a white light LED device is formed by filling an epoxy resin containing phosphors around a blue light LED chip and then a lens is capped thereon. However, poor thickness uniformity of the filled epoxy resin reduces the light-emitting properties of the LED devices. Another method to form the white light LED device is to fill a transparent protective resin or glue around a blue light LED chip followed by coating an epoxy resin layer containing phosphors thereon and capping a lens on top. However, the coating rate of the epoxy resin layer is slow and it is also difficult to control the thickness uniformity of the epoxy resin layer. Further another method to form the white light LED device is to form a lens on a blue light LED chip followed by coating an epoxy resin layer containing phosphors thereon and covering the lens with a transparent protective resin or glue. However, the coating rate of the epoxy resin layer is also slow and the manufacturing cost is high.

Therefore, there is a need to develop a novel LED device capable of addressing the above problems.

BRIEF SUMMARY OF THE INVENTION

A detailed description is given in the following embodiments with reference to the accompanying drawings. A semiconductor device and a method for fabricating the same are provided. An embodiment of a semiconductor device comprises a light-emitting diode chip disposed in a cavity of a semiconductor substrate. At least two isolated outer wiring layers are disposed on the bottom surface of the semiconductor substrate and are electrically connected to the light-emitting diode chip, serving as input terminals. A lens module is adhered to the top surface of the semiconductor substrate to cap the cavity, in which the lens module comprises a molded lens and a transparent conductive layer coated with a fluorescent material under the molded lens.

An embodiment of a method for fabricating a semiconductor devise comprises providing a glass wafer having a first side and an opposing second side. A transparent conductive layer is formed on the first side of the glass wafer. A resist pattern layer is formed on the transparent conductive layer, having a plurality of openings exposing the transparent conductive layer. Each opening is filled with a fluorescent material. A plurality of lenses is formed on the second side of the glass wafer and corresponding to the plurality of openings. The resist pattern layer is removed to form a lens plate. A semiconductor wafer is capped with the lens plate, in which the semiconductor wafer comprises a plurality of cavities corresponding to the fluorescent materials of the lens plate, and a plurality of light-emitting diode chips in the corresponding cavities. The bottom surface of the semiconductor wafer is etched to form a plurality of notches between the adjacent cavities to form individual semiconductor substrates. The lens plate is cut from the plurality of notches to form individual lens modules on the corresponding semiconductor substrates.

Another embodiment of a method for fabricating semiconductor devises comprises providing a semiconductor wafer comprising a plurality of cavities adjacent to each other and a plurality of light-emitting diode chips in the corresponding cavities. A transparent resin is formed on the top surface of the semiconductor wafer and fills each cavity to cover the corresponding light-emitting diode chip. A transparent conductive layer is formed on the transparent resin. A resist pattern layer is formed on the transparent conductive layer, having a plurality of openings corresponding to the cavities and exposing the transparent conductive layer. Each opening is filled with a fluorescent material. A lens is formed on each fluorescent material. The semiconductor wafer between the adjacent cavities, the transparent resin, and the transparent conductive layer are successively cut to form individual semiconductor substrates with a corresponding lens module comprising the lens, the fluorescent material and the transparent conductive layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 2A:
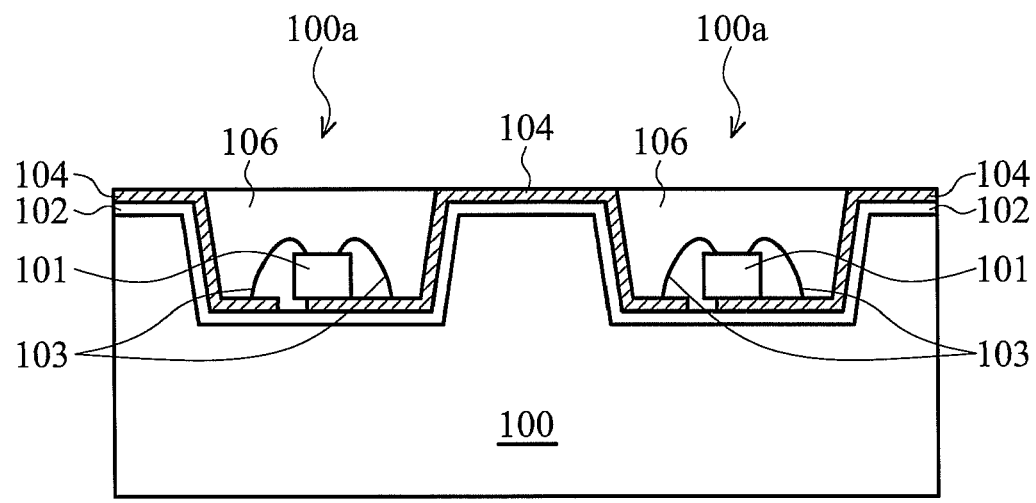
FIGS. 2A to 2D are cross sections of an exemplary embodiment of a method for fabricating LED devices according to the invention.
Figure 2B:
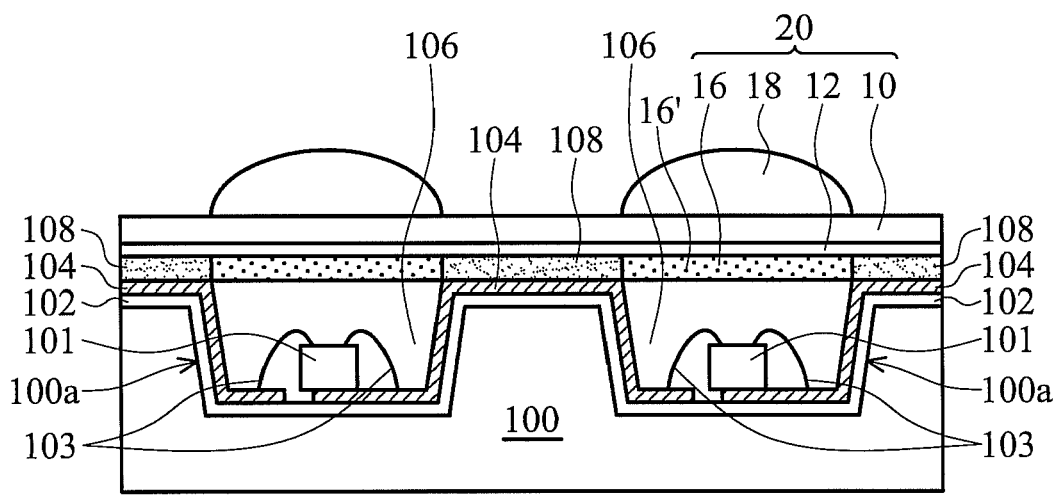
Figure 2C:
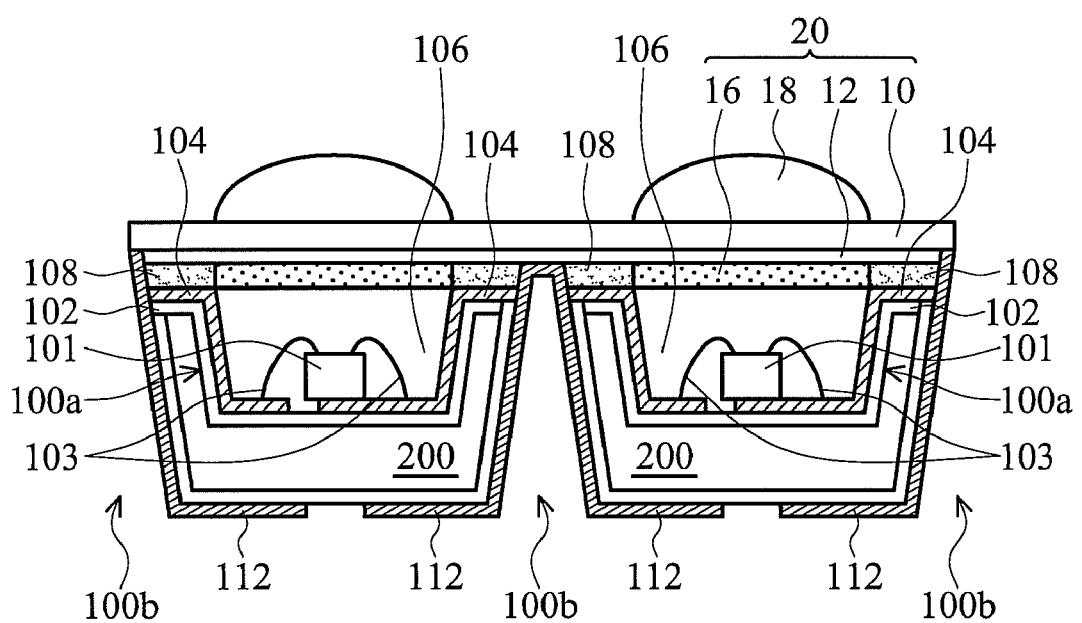
Figure 2D:
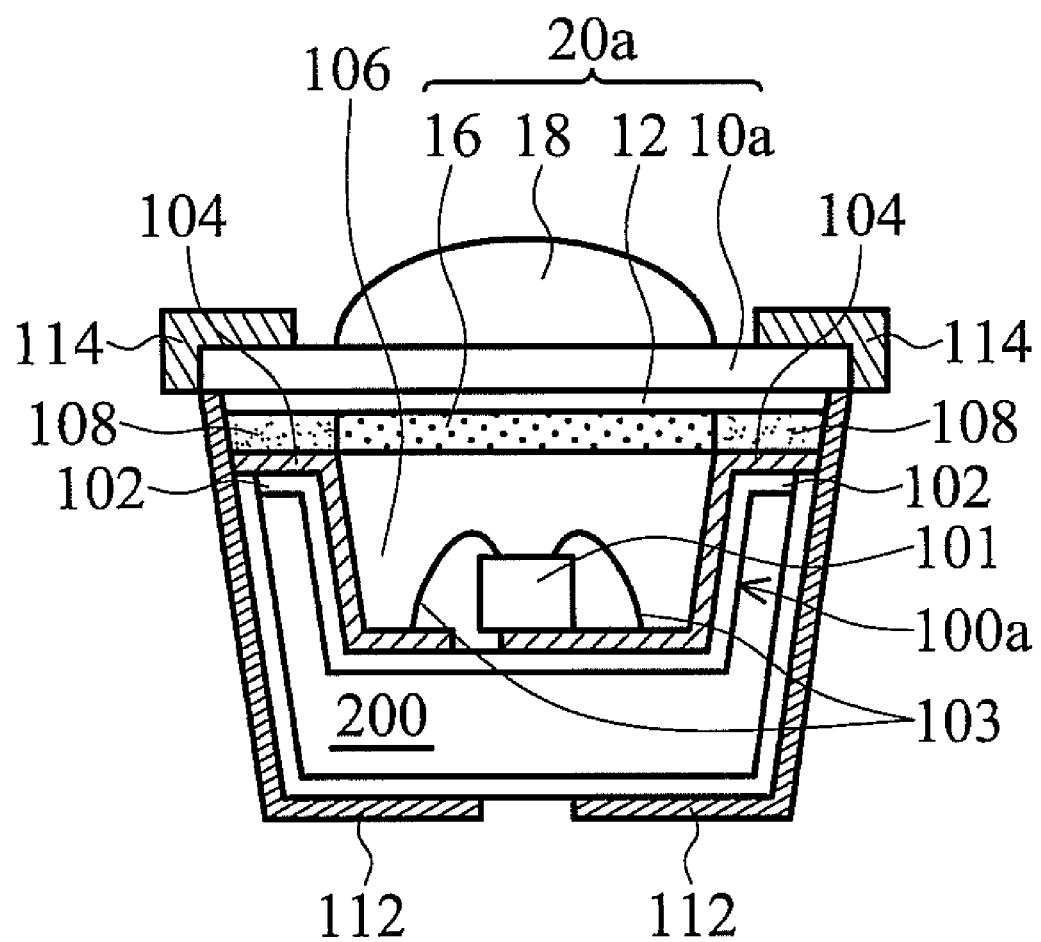
Figure 3A:
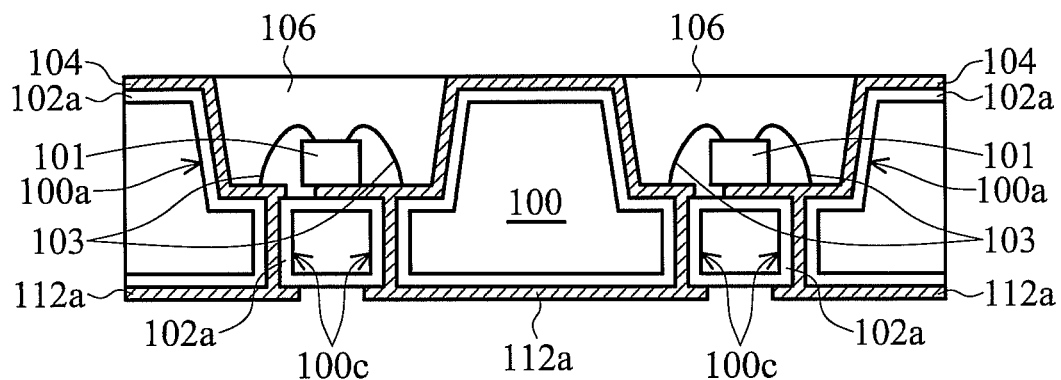
FIGS. 3A to 3D are cross sections of another exemplary embodiment of a method for fabricating LED devices according to the invention.
Figure 3B:
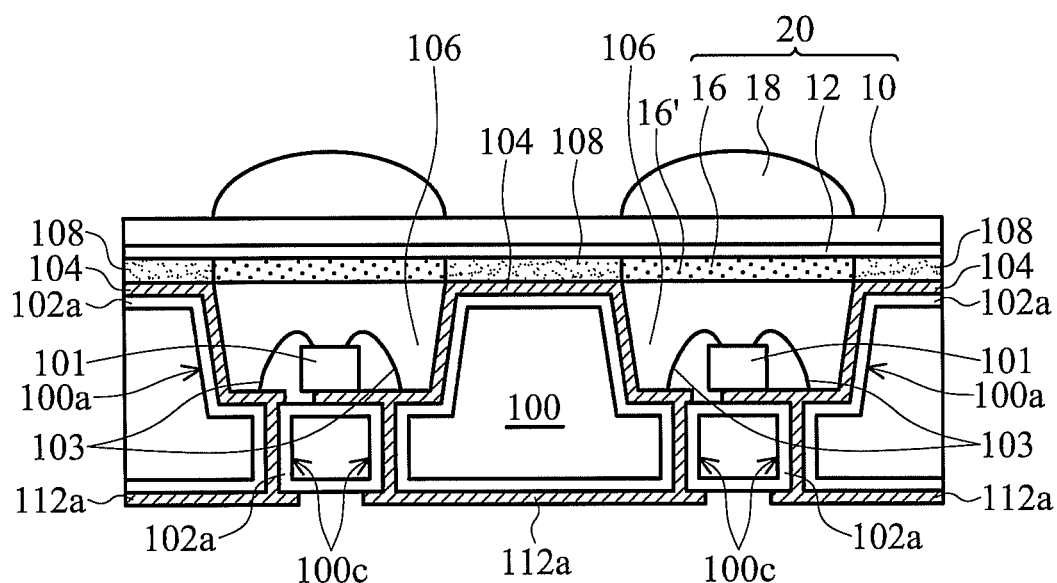
Figure 3C:
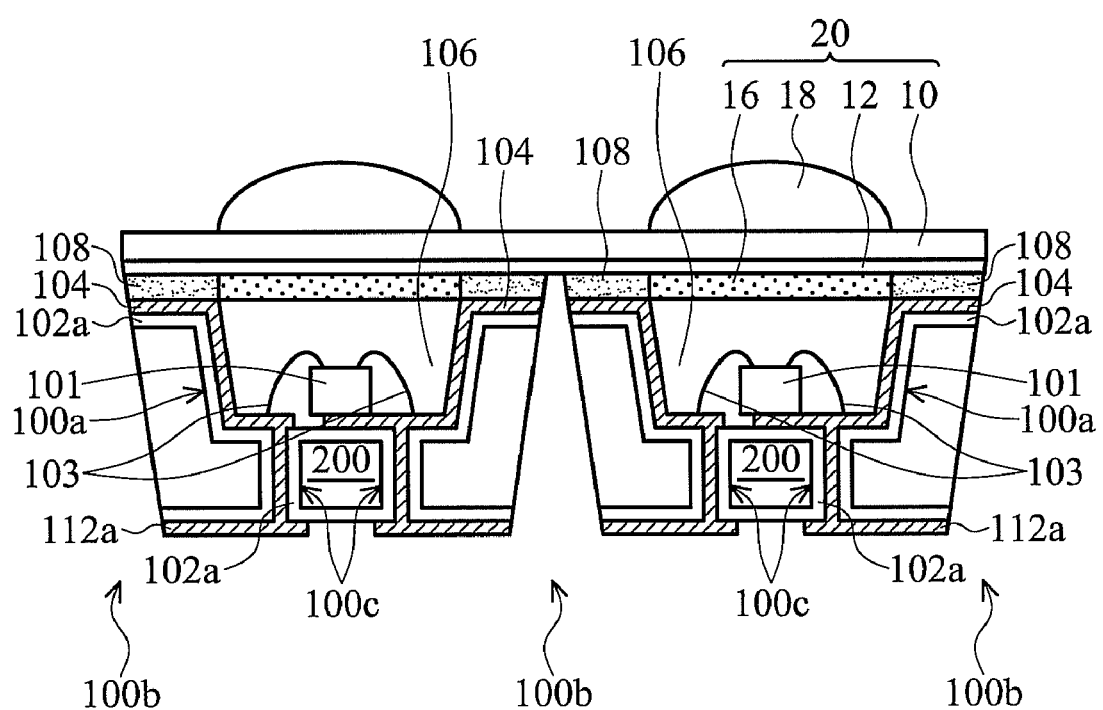
Figure 3D:
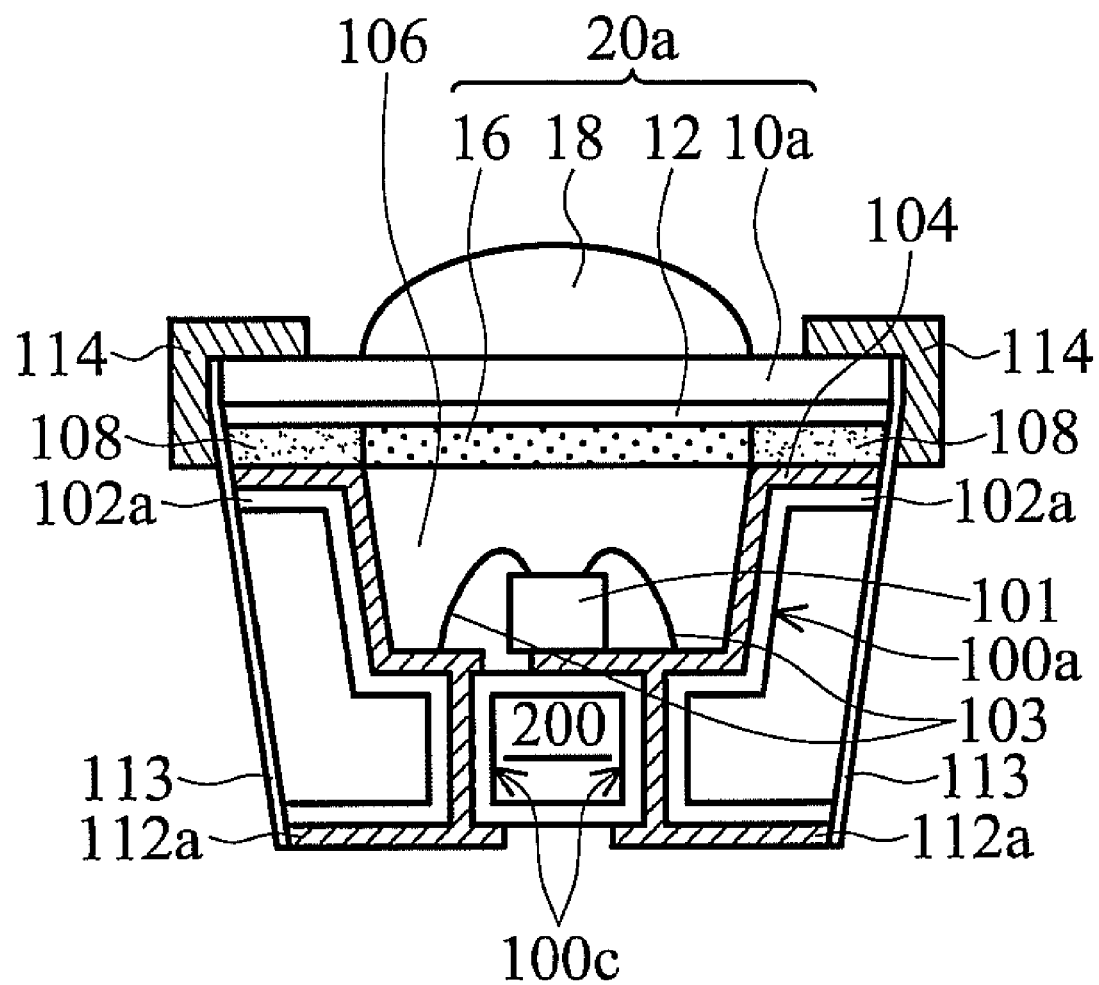
Figure 4A:
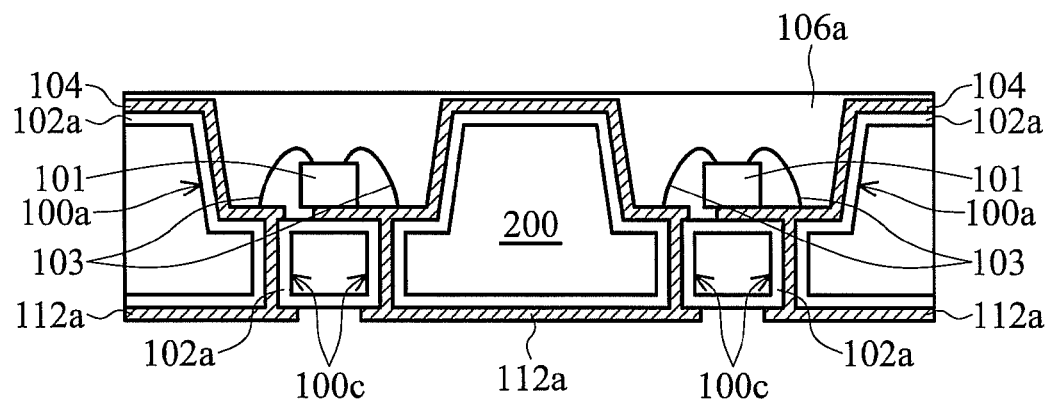
FIGS. 4A to 4D are cross sections of yet another exemplary embodiment of a method for fabricating LED devices according to the invention.
Figure 4B:
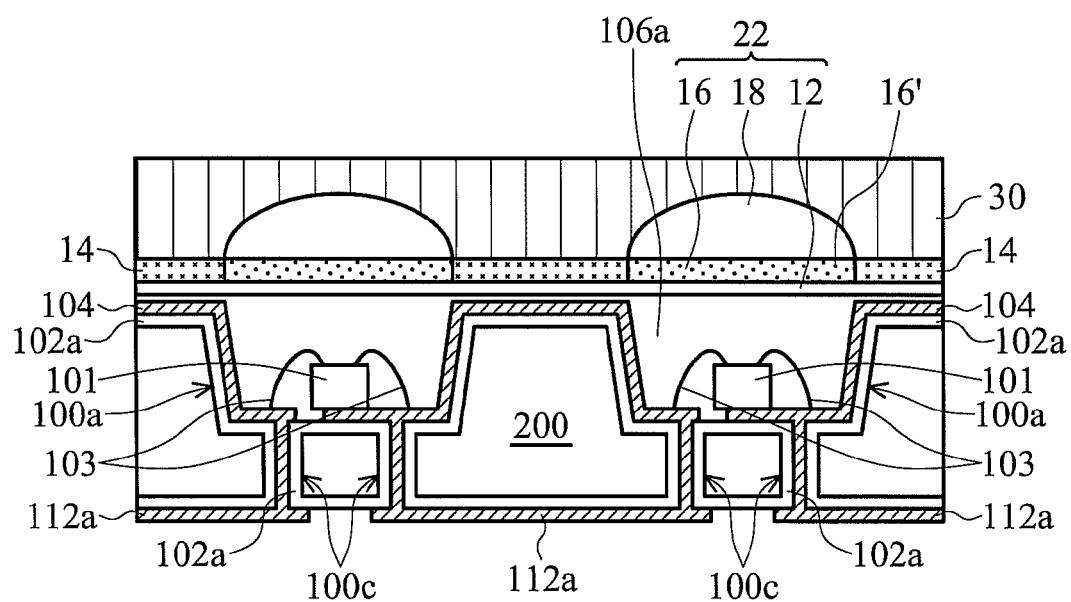
Figure 4C:
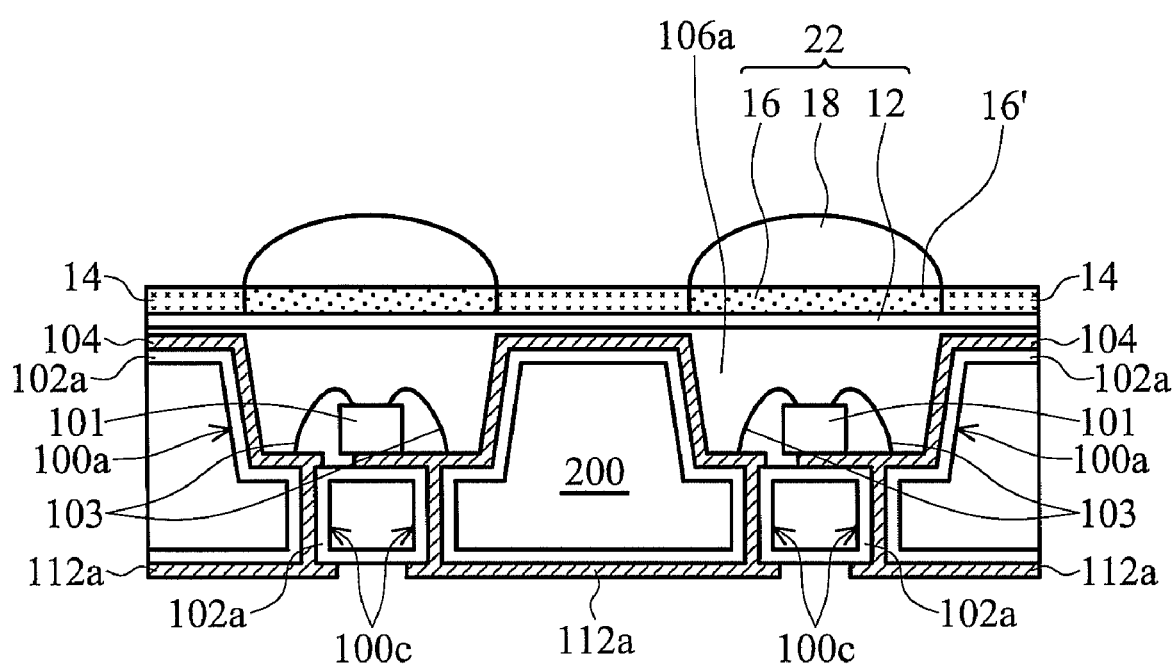

FIGS. 2D, 3D and 4C, are cross sections of various exemplary embodiments of LED devices according to the invention, respectively. Elements in FIGS. 3D and 4C that are the same as those in FIG. 2D are labeled with the same reference numbers as in FIG. 2D and are not described again for brevity. Referring to FIG. 2D, the LED device comprises a semiconductor substrate 200, such as a silicon substrate or other semiconductor substrates well known in the art, having a cavity 100a. The semiconductor substrate 200 may contain a variety of elements, including, for example, transistors, resistors, and other semiconductor elements well known in the art. In order to simplify the diagram, the variety of elements is not depicted.

At least two isolated inner wiring layers 104 are disposed in the cavity 100a. A light-emitting diode (LED) chip 101, such as a blue light LED chip (or die), is disposed in the cavity 100a and is electrically connected to the inner wiring layers 104 by wire bonding through wiring lines 103. In another embodiment, the LED chip 101 can be electrically connected to the inner wiring layers 104 by a flip chip method. At least two isolated outer wiring layers 112 are disposed on the bottom surface of the semiconductor substrate 200, serving as input terminals. In the embodiment, the outer wiring layers 112 extend to sidewalls of the semiconductor substrate 200 and the inner wiring layers 104 extend to the top surface of the semiconductor substrate, such that the outer wiring layers 112 are directly connected to the inner wiring layers 104, respectively, so as to be electrically connected to the LED chip 101.

A transparent resin 106, such as epoxy or glue, may be optionally filled into the cavity 100a to cover and protective the LED chip 101.

Figure 1A:
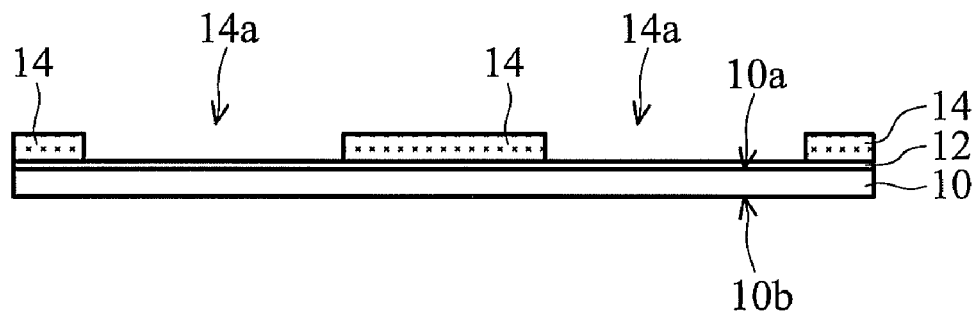
FIGS. 1A to 1D are cross sections of an exemplary embodiment of a method for fabricating a lens plate according to the invention.
Figure 1B:
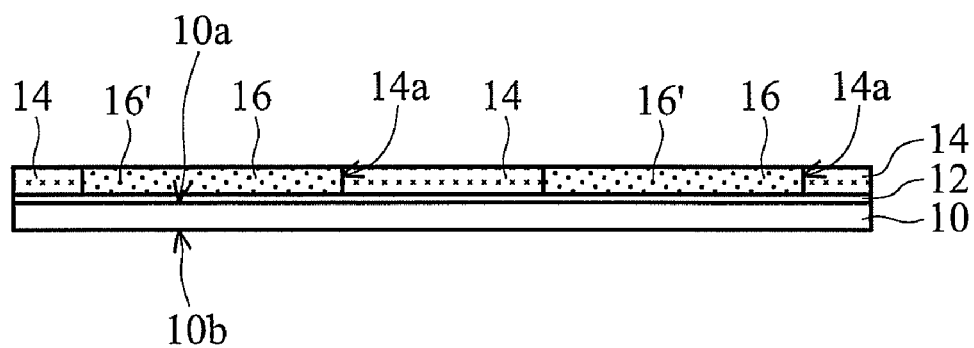
Figure 1C:
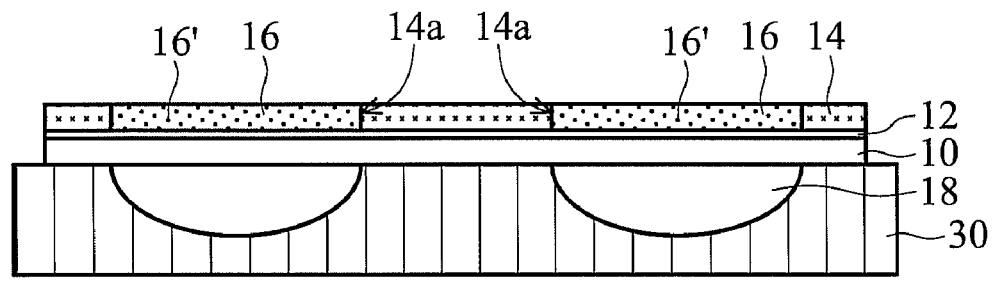
Figure 1D:
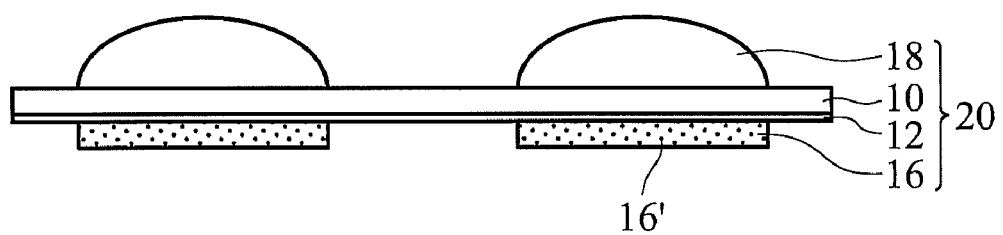
Figure 1E:
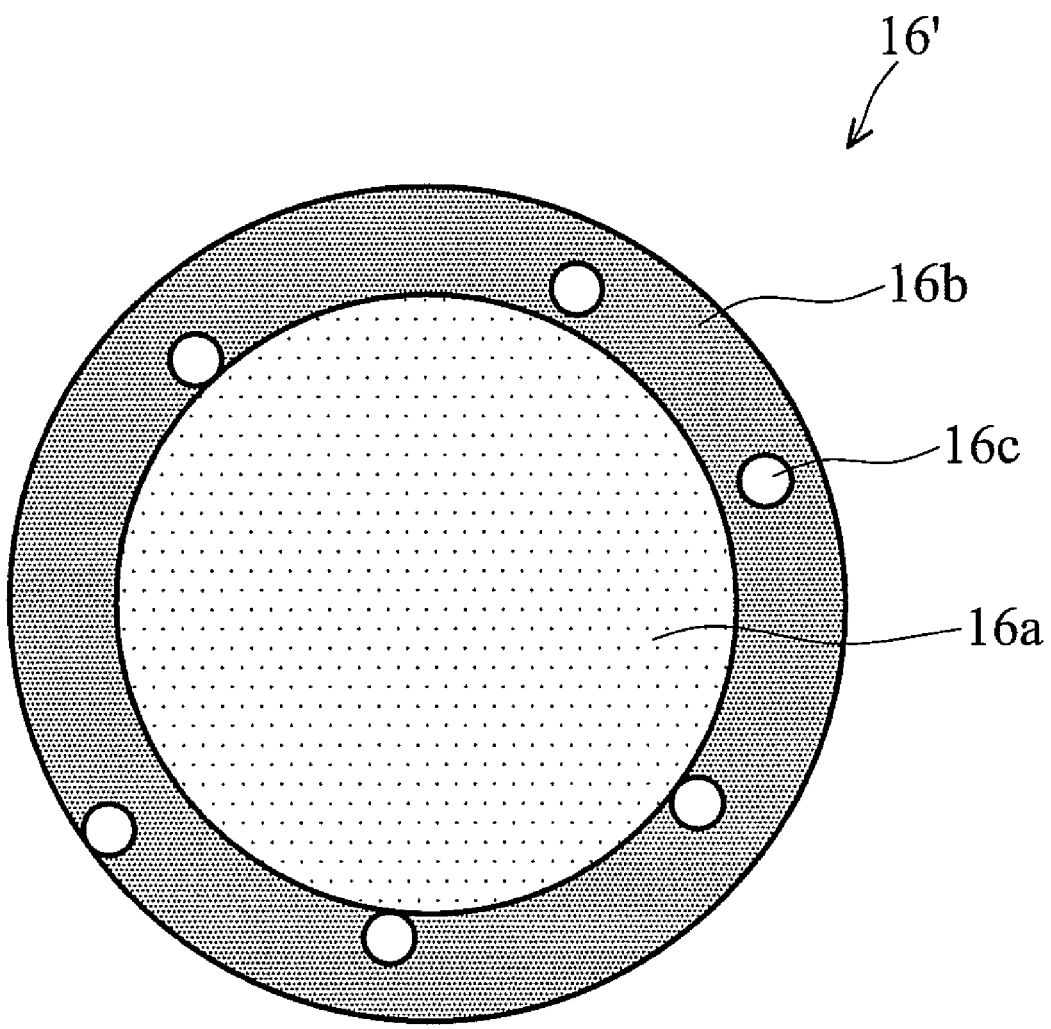
FIG. 1E is an enlarged view of a phosphor particle with a core-shell structure shown in FIGS. 1B to 1C.

A lens module 20a is adhered to the top surface of the semiconductor substrate 200 by an adhesion layer 108, to cap the cavity 100a. In the embodiment, the lens module 20a comprises a molded lens 18, a transparent conductive layer 12 coated with a fluorescent material 16 corresponding to the LED chip 101, and a glass substrate 10a is interposed between the transparent conductive layer 12 and the molded lens 14. The fluorescent material 16 under the molded lens 18 faces the LED chip 101. As shown in FIG. 1D, the fluorescent material 16 may comprise a plurality of phosphor particles 16' therein and the surface of each phosphor particle 16' is covered by a gel 16b containing silicon dioxide ($SiO_2$) and aluminum oxide ($Al_2O_3$) to form a core-shell structure. In particular, the gel 16b contains a plurality of titanium dioxide ($TiO_2$) particles therein, thereby enhancing luminous efficiency of the LED device.

A reflective layer 114, such as metal or well reflective material, can be coated on the edge of the lens module 20a for prevention of light leakage. Thus, brightness of the LED device can be increased.

Referring to FIG. 3D, unlike the LED device shown in FIG. 2D, the semiconductor device 200 may comprise at least two through openings 100c under the cavity 100a, such that at least two outer wiring layers 112a are electrically connected to the inner wiring layers 104 by the through openings 100c, respectively. Moreover, an insulating layer 113 optionally covers the sidewalls of the semiconductor substrate 200 and the lens module 20a.

Figure 4D:
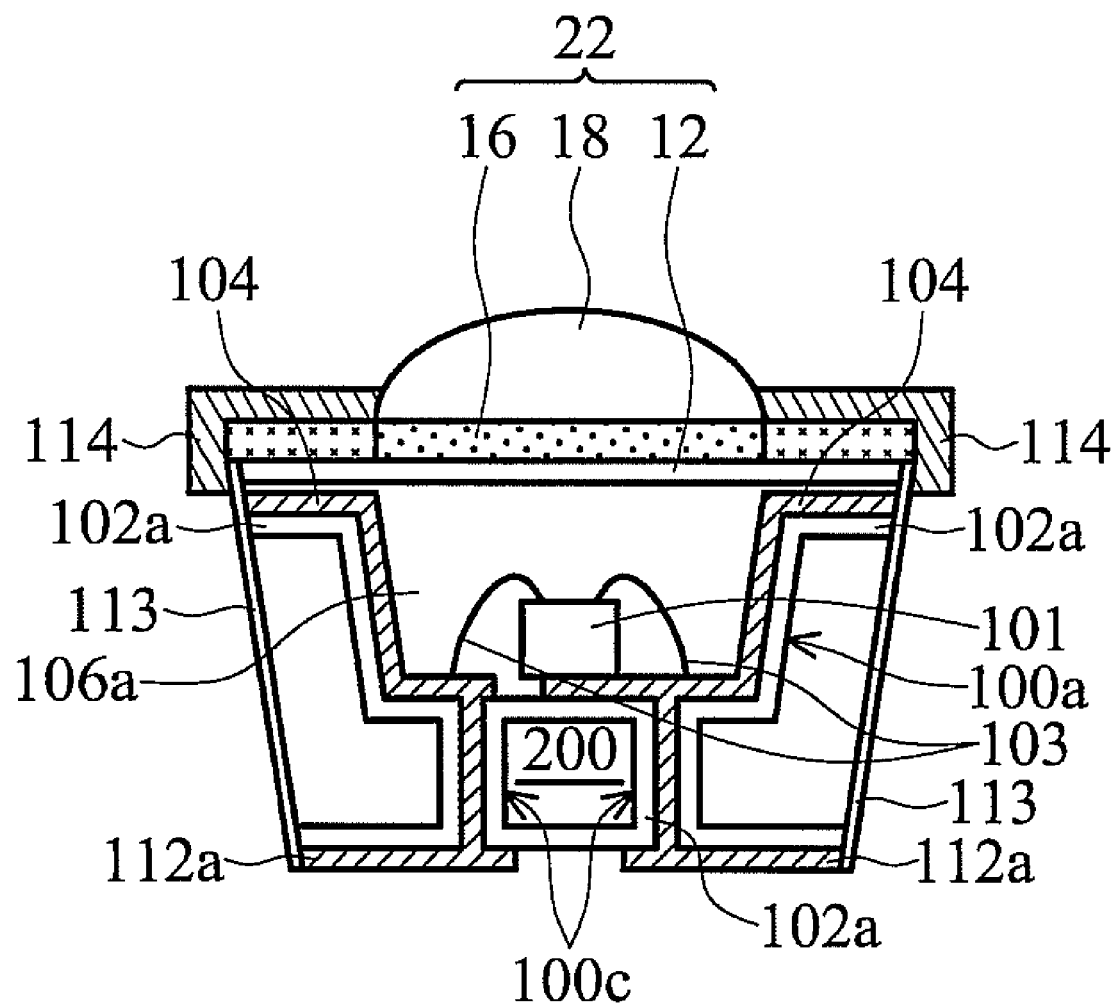

Referring to FIG. 4D, unlike the LED device shown in FIG. 3D, the fluorescent material 16 is directly adhered under the molded lens 18 without the glass substrate 10a interposed between the transparent conductive layer 12 and the molded lens 18. That is, the fluorescent material 16 is between the transparent conductive layer 12 and the molded lens 18. Moreover, in order to prevent the transparent conductive layer 12 from electrically connecting to the two isolated inner wiring layers 104, a transparent resin 106a is formed on the top surface of the semiconductor substrate 200 and fills the cavity 100a to cover the two isolated inner wiring layers 104 and the LED chip 101. That is, a lens module 22 comprising the transparent conductive layer 12, the molded lens 18, and the fluorescent material 16 therebetween is adhered to the transparent resin 106a without formation of the adhesion layer 108 shown in FIG. 2D or 3D.

Referring to FIGS. 2A to 2D, which are cross sections of an exemplary embodiment of a method for fabricating LED devices according to the invention. As shown in FIG. 2A, a semiconductor wafer 100, such as a silicon wafer or other semiconductor wafers well known in the art, is provided. The semiconductor wafer 100 comprises a plurality of cavities 100a adjacent to each other and arranged as an array. In order to simplify the diagram, only two adjacent cavities 100a are depicted.

An insulating layer 102, such as a silicon oxide layer formed by a thermal oxidation, chemical vapor deposition (CVD) or other conventional deposition processes, and a metal layer (not shown) are successively and conformally formed on the top surface of the semiconductor wafer 100 and the inner surface of each cavity 100a. The metal layer may comprise aluminum (Al), copper (Cu), nickel (Ni), aurum (Au), or argentum (Ag) or alloys thereof. Moreover, the metal layer is then patterned by a lithography and etching process to form at least two isolated inner wiring layers 104 in each cavity 100a. The inner wiring layers 104 also extend to the top surface of the semiconductor wafer 100.

A plurality of LED chips 101 is correspondingly provided in the plurality of cavities 100a and is electrically connected to the corresponding inner wiring layers 104 by wire bonding through wiring lines 103 or by a flip chip method through bumps (not shown). A transparent resin 106, such as epoxy or glue, may be optionally filled into each cavity 100a to cover and protective each light-emitting diode chip 101.

As shown in FIG. 2B, the plurality of cavities 100a of the semiconductor wafer 100 is capped with a lens plate 20 by an adhesion layer 108, such as an epoxy layer. FIGS. 1A to 1D, are cross sections showing a method for fabricating the lens plate 20. In FIG. 1A, a glass wafer 10 having a first side 10a and an opposing second side 10b is provided. A transparent conductive layer 12, such as an indium tin oxide (ITO) or indium zinc oxide (IZO) layer, is formed on the first side 10a of the glass wafer 10. The transparent conductive layer 12 has a thickness of about 100 Å to 800 Å. A resist pattern layer 14 is subsequently formed on the transparent conductive layer 12 by a conventional lithography. The resist pattern layer 14 has a plurality of openings 14a corresponding to the cavities 100a shown in FIG. 2A and exposing the transparent conductive layer 12. In order to simplify the diagram, only two openings 14a are depicted. In FIG. 1B, each opening 14a is filled with a fluorescent material 16, such as a phosphor layer. In the embodiment, the fluorescent material 16 can be formed by the following steps. First, a so-gel process is performed by mixing of a first solution containing titanium dioxide ($TiO_2$), ethanol, and tetraethyl orthosilicate (TEOS) or tetramethyl orthosilicate (TMOS), a second solution containing aluminum iso-propoxide (Al-iPO) or aluminum tri-sec-butoxide (Al-tsBO) and ethanol or acetylacetone, and a third solution containing phosphor and ethanol or water. Next, the mixture including the first, second, and third solutions is heated at a temperature of about 60-100° C. for 1-20 hours. Next, an electrophoresis deposition process is performed using the mixture as a precursor, isopropyl alcohol (IPA) as a carrier solution, and the transparent conductive layer 12 as a cathode. During the electrophoresis deposition process, magnesium nitrate (Mg(NO$_3$)$_2$) may be added into the mixture to increase the conductivity thereof. Additionally, a surface treatment can be optionally performed on the transparent conducting layer 12 by acid washing, using a mixture of sulfuric acid (H$_2$SO$_4$) and hydrogen peroxide (H$_2$O$_2$), such that the surface of the transparent conducting layer 12 has OH groups, which are advantageous for enhancing adhesion between the fluorescent material 16 and the transparent conducting layer 12. After the electrophoresis deposition process is completed, the fluorescent material 16 is filled in each opening 14a, in which the fluorescent material 16 may comprise a plurality of phosphor particles 16' therein and the surface of each phosphor particle 16' is covered by a gel 16b containing silicon dioxide (SiO$_2$) and aluminum oxide (Al$_2$O$_3$) to form a core-shell structure. In particular, the gel 16b contains a plurality of titanium dioxide (TiO$_2$) particles therein. In FIG. 1C, a plurality of molded lenses 18 comprising, for example, a resin material, is formed on the second side 10b of the glass wafer 10 corresponding to the fluorescent materials 16 by a mold 30. After removal of the mold 30 and the resist pattern layer 14, a lens plate 20 is completed, as shown in FIG. 1D. Each fluorescent material 16 of the lens plate 20 faces to the corresponding LED chip 101 after the lens plate 20 is adhered to the semiconductor wafer 100.

As shown in FIG. 2C, the semiconductor wafer 100 is thinned by grinding (or polishing, such as chemical mechanical polishing, CMP) the bottom surface thereof. Next, the grounded bottom surface of the semiconductor wafer 100 and the overlying adhesion layer 108 are successively etched to form a plurality of notches 100b between the adjacent cavities 100a to form individual semiconductor substrates 200 and expose the transparent conductive layer 12. At least two isolated outer wiring layers 112 is formed on the bottom surface of each semiconductor substrate 200 by depositing of a metal layer (not shown) followed by a lithography and etching process. The outer wiring layers 112 may comprise the same or similar material as the inner wiring layers 104. In the embodiment, the outer wiring layers 112 serve as input terminals and extend to sidewalls of each semiconductor substrate 200 and the exposed transparent conductive layer 12, such that the two outer wiring layers 112 are directly connected to the corresponding inner wiring layers 104 and are electrically connected to the corresponding LED chip 101. In some embodiments, the molded lenses 18 can be formed on the glass wafer 10 after grinding the bottom surface of the semiconductor wafer 100, forming notches 100b, and forming the isolated outer wiring layers 112.

As shown in FIG. 2D, the lens plate 20 is cut from the plurality of notches 100b to form individual lens modules 20a on the corresponding semiconductor substrates 200. In order to simplify the diagram, only a semiconductor substrate 200 having a lens module 20a thereon is depicted. Next, the edge of each lens module 20a is coated with a reflective layer 114 for prevention of light leakage, thereby increasing brightness of the LED chips 101. As a result, completing the LED device of this embodiment.

Referring to FIGS. 3A to 3D, which are cross sections of another exemplary embodiment of a method for fabricating LED devices according to the invention. Elements in FIGS. 3A to 3D that are the same as those in FIGS. 2A to 2D are labeled with the same reference numbers as in FIGS. 2A to 2D and are not described again for brevity. As shown in FIG. 3A, a semiconductor wafer 100 comprising a plurality of cavities 100a adjacent to each other and at least two through openings 100c under each cavity 100a is provided.

An insulating layer 102a, such as a silicon oxide layer formed by a thermal oxidation, chemical vapor deposition (CVD) or other conventional deposition process, is conformally formed on the top and bottom surfaces of the semiconductor wafer 100, the inner surface of each cavity 100a, and the inner surface of each through openings 100c. Next, two metal layers (not shown) are conformally formed on the insulating layer 102a overlying the top and bottom surfaces of the semiconductor wafer 100, respectively, and fill the through openings 100c. The metal layers are then patterned by a lithography and etching process to form at least two isolated inner wiring layers 104 in each cavity 100a and at least two isolated outer wiring layers 112a on the semiconductor wafer 100 under each cavity 100a. Thus, the two outer wiring layers 112a under each cavity 100a are electrically connected to the corresponding inner wiring layers 104 by the through openings 100c.

As shown in FIG. 3B, the plurality of cavities 100a of the semiconductor wafer 100 is capped with a lens plate 20 shown in FIG. 1C.

As shown in FIG. 3C, the bottom surface of the semiconductor wafer 100 and the overlying adhesion layer 108 are successively etched to form a plurality of notches 100b between the adjacent cavities 100a to form individual semiconductor substrates 200 and expose the glass wafer 10.

As shown in FIG. 3D, the lens plate 20 is cut from the plurality of notches 100b to form individual lens modules 20a on the corresponding semiconductor substrates 200. An insulating layer 113 may optionally cover the sidewalls of each semiconductor substrate 200 and each lens module 20a. Also, the edge of each lens module 20a is coated with a reflective layer 114 for prevention of light leakage. As a result, completing the LED device of this embodiment.

Referring to FIGS. 4A to 4D, which are cross sections of yet another exemplary embodiment of a method for fabricating LED devices according to the invention. Elements in FIGS. 4A to 4D that are the same as those in FIGS. 3A to 3D are labeled with the same reference numbers as in FIGS. 3A to 3D and are not described again for brevity. As shown in FIG. 4A, a semiconductor wafer 100 having a structure similar to that shown in FIG. 3A is provided. In this embodiment, a transparent resin 106a is formed on the top surface of the semiconductor wafer 100 and fills each cavity 100a to cover the corresponding isolated inner wiring layers 104 and the LED chip 101.

As shown in FIG. 4B, a transparent conductive layer 12 comprising ITO or IZO has a thickness of about 100 Å to 800 Å and is formed on the transparent resin 106a. A resist pattern layer 14 is subsequently formed on the transparent conductive layer 12 by a conventional lithography process, having a plurality of openings 14a corresponding to the cavities 100a and exposing the transparent conductive layer 12. Each opening 14a is filled with a fluorescent material 16 by an electrophoresis deposition process as mentioned previously. A plurality of molded lenses 18 is formed on the corresponding fluorescent materials 16 by a mold 30.

As shown in FIG. 4C, the mold 30 4 is removed. Next, as shown in FIG. 4D, the semiconductor wafer 100 between the adjacent cavities 100a, the overlying transparent resin 106a and the overlying transparent conductive layer 12 are successively cut to form individual semiconductor substrates 200 with the corresponding lens module 22. An insulating layer 113 may optionally cover the sidewalls of each semiconductor substrate 200 and each lens module 22. Also, the edge of each lens module 22 is coated with a reflective layer 114 for prevention of light leakage. As a result, completing the LED device of this embodiment.

According to the aforementioned embodiments, the fluorescent material is formed on an additional glass carrier or a transparent conductive layer. Compared to the conventional fluorescent layer filled around an LED chip, thickness uniformity of the fluorescent material can be improved. Moreover, since the fluorescent layers are formed by electrophoresis and the LED devices are packaged by a wafer level package, high production rate can be obtained and manufacturing costs can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate having a cavity;
   a light-emitting diode chip disposed in the cavity;
   at least two isolated outer wiring layers disposed on the bottom surface of the semiconductor substrate and electrically connected to the light-emitting diode chip, serving as input terminals; and
   a lens module adhered to the top surface of the semiconductor substrate to cap the cavity, comprising:
   a molded lens; and
   a transparent conductive layer coated with a fluorescent material under the molded lens.

2. The semiconductor device of claim 1, wherein the lens module further comprises a glass substrate interposed between the transparent conductive layer and the molded lens.

3. The semiconductor device of claim 1, further comprising a transparent resin on the top surface of the semiconductor substrate and filled into the cavity to cover the light-emitting diode chip.

4. The semiconductor device of claim 3, wherein the fluorescent material is between the molded lens and the transparent conductive layer.

5. The semiconductor device of claim 1, further comprising a reflective layer coated on the edge of the lens module.

6. The semiconductor device of claim 1, further comprising at least two isolated inner wiring layers disposed in the cavity, electrically connected between the light-emitting diode chip and the isolated outer wiring layers.

7. The semiconductor device of claim 6, wherein the semiconductor substrate comprises at least two through openings under the cavity, such that the outer wiring layers are electrically connected to the inner wiring layers by the through openings, respectively.

8. The semiconductor device of claim 7, further comprising an insulating layer covering the sidewalls of the semiconductor substrate and the lens module.

9. The semiconductor device of claim 6, wherein the outer wiring layers extend to sidewalls of the semiconductor substrate and the inner wiring layers extend to the top surface of the semiconductor substrate, such that the outer wiring layers are directly connected to the inner wiring layers, respectively.

10. The semiconductor device of claim 1, wherein the fluorescent material comprises a plurality of phosphor particles therein and the surface of each phosphor particle is covered by a gel containing silicon dioxide and aluminum oxide to form a core-shell structure.

11. The semiconductor device of claim 10, wherein the gel further contains a plurality of titanium dioxide particles therein.

* * * * *